(12) United States Patent  
Salmonson

(10) Patent No.: US 6,305,463 B1  
(45) Date of Patent: Oct. 23, 2001

(54) AIR OR LIQUID COOLED COMPUTER MODULE COLD PLATE

(75) Inventor: Richard B. Salmonson, Chippewa Falls, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 724 days.

(21) Appl. No.: 08/604,841

(22) Filed: Feb. 22, 1996

(51) Int. Cl.[7] .................................................. H05K 7/20
(52) U.S. Cl. .................. 165/80.3; 165/80.4; 165/185; 174/16.3; 257/714; 257/722; 361/698; 361/699; 361/702; 361/704
(58) Field of Search .................. 165/80.3, 80.4, 165/185, 104.33, 168; 174/16.3; 257/714, 722, 721; 361/698, 699, 689, 707, 717, 720, 704, 702

(56) References Cited

U.S. PATENT DOCUMENTS

| | | | |
|---|---|---|---|
| 3,327,776 | * | 6/1967 | Butt .................................. 165/80.4 |
| 4,635,709 | * | 1/1987 | Altoz ............................... 361/698 X |
| 4,884,168 | * | 11/1989 | August et al. ...................... 361/702 |
| 4,941,530 | * | 7/1990 | Crowe ............................. 165/104.33 |
| 5,006,924 | * | 4/1991 | Frankeny et al. .............. 165/80.4 X |
| 5,034,852 | * | 7/1991 | Rosenberg ...................... 361/707 X |

OTHER PUBLICATIONS

Chu, R.C. "Counter–Flow Cooling System", IBM TDB, vol. 8, No. 11, Apr. 1966, p. 1692.*

* cited by examiner

Primary Examiner—Leonard Leo  
(74) Attorney, Agent, or Firm—Schwegman, Lundberg, Woessner & Kluth, P.A.

(57) ABSTRACT

A cold plate that provides air or liquid cooling for a computer circuit module and has at least one mounting plate with a board mounting surface on one side for carrying a printed circuit board assembly and a cooling surface located on the other side. A cover is disposed parallel to and spaced apart from the mounting plate with a cooling chamber defined between the two. The cooling chamber is divided into a liquid cooled section and an air cooled section. The liquid cooled section has a coolant inlet and outlet and flow channels for directing coolant through the liquid cooled section from inlet to outlet. The air cooled section has an air inlet and outlet and flow channels for directing air through the air cooled section from inlet to outlet. The cold plate is adapted so that it may be installed into a circuit module and provide either liquid cooling or air cooling for the module.

15 Claims, 7 Drawing Sheets

AIR OR LIQUID COOLED COMPUTER MODULE COLD PLATE

STATEMENT REGARDING GOVERNMENT RIGHTS

The present invention was made with government support under MDA 972-95-3-0032, awarded by ARPA. The Government has certain rights in this invention.

FIELD OF THE INVENTION

The present invention relates to computer circuit modules and more specifically to a cold plate for dissipating heat generated by the clock module electronic components.

BACKGROUND OF THE INVENTION

High speed electronic digital computers of the type produced by Cray Research, Inc., the assignee hereof, generally utilize densely packaged or stacked banks of circuit modules including what are commonly known as clock modules. A circuit module often includes a pair of printed circuit board assemblies with a heat sink or "cold plate" sandwiched between them for dissipating heat generated by the electronic devices mounted to the board. Each clock module typically includes a single clock printed circuit board assembly which carries thereon a number of circuit, logic and memory devices including numerous integrated circuits. The clock circuit board assembly is also mounted to a cold plate. Typically, the cold plate for the clock circuit board must be custom designed for end application.

Proper cooling is essential in supercomputers; excess heat can build up, causing malfunction and failure of integrated circuits and other electronic components. The importance of effective and efficient cooling for each application grows as circuit board assemblies become smaller and more densely packed with ever smaller, faster components. Some supercomputers can get by with a less expensive, lower maintenance air cooling system. Others require the more efficient cooling of a liquid cooled system.

In today's competitive market, the computer industry is driven to reduce the size and increase the speed of computers and components, reduce the number of parts and part variations, reduce manufacturing and assembly complexity, and reduce manufacturing, assembly and part costs. One of the ways the industry has used to achieve the these goals is to produce standardized, interchangeable components and modular assemblies to eliminate the prior practice of using custom designed components.

In the past, the type of cold plate for any given clock module design would depend on whether the cooling system of the particular computer application into which it was installed was air or liquid cooled. Companies would have to build and maintain an air cooled version constructed utilizing an air cooled cold plate and a liquid cooled version constructed using a liquid cooled cold plate.

What is needed is a single cold plate that will replace both a liquid cooled and air cooled cold plate. What is also needed is a single cold plate which will satisfactorily cool a variety of clock modules and components. Additionally, what is needed is a cold plate that will provide efficient cooling in both air cooled and liquid cooled computer applications. What is further needed is an apparatus which will function as either a liquid cooled or air cooled cold plate.

SUMMARY OF THE INVENTION

The present invention teaches an apparatus for dissipating heat generated by electronic computer components mounted on a clock printed circuit board assembly. The apparatus may be used in applications requiring either air cooling or liquid cooling to dissipate heat from the module.

A cold plate for a clock module has a cover and a mounting plate spaced apart from one another. The mounting plate has a board mounting surface on one side for carrying thereon a printed circuit board assembly. A cooling chamber is defined by the space between the cover and the mounting plate for housing therein both a liquid cooled and an air cooled section.

The liquid cooled section is constructed to direct a liquid coolant therethrough for carrying away heat generated by the clock printed circuit board assembly. The air cooled section is constructed to direct air therethrough for carrying away the generated heat. The liquid and air cooled sections are arranged so that either one may be used independent of the other, depending on the type of application in which it is to be installed. Either section provides adequate dissipation of heat from the clock board assembly through the mounting plate and into the cooling chamber to be carried away either by the coolant flowing through the liquid cooled section or air flowing through the air cooled section.

The liquid cooled section has a coolant inlet, a coolant outlet and a coolant flow channel. Coolant flows from the coolant inlet through the coolant flow channel to the coolant outlet and collects heat as it flows therethrough. The air cooled section has an air inlet, an air outlet and an air flow channel. Air flows from the air inlet through the air flow channel to the air outlet and collects heat as it flows therethrough.

According to one aspect of the present invention, the cold plate is adaptable for use in circuit modules requiring either air cooling or liquid cooling. The cold plate provides adequate and efficient air or liquid cooling for computer circuit modules.

According to another aspect of the present invention, the cold plate replaces two separate liquid cooled and air cooled cold plates thereby reducing the number of parts required to build circuit modules for different applications.

According to yet another aspect of the present invention, the invention simplifies the module manufacturing process by reducing the variety of parts to track and stock.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
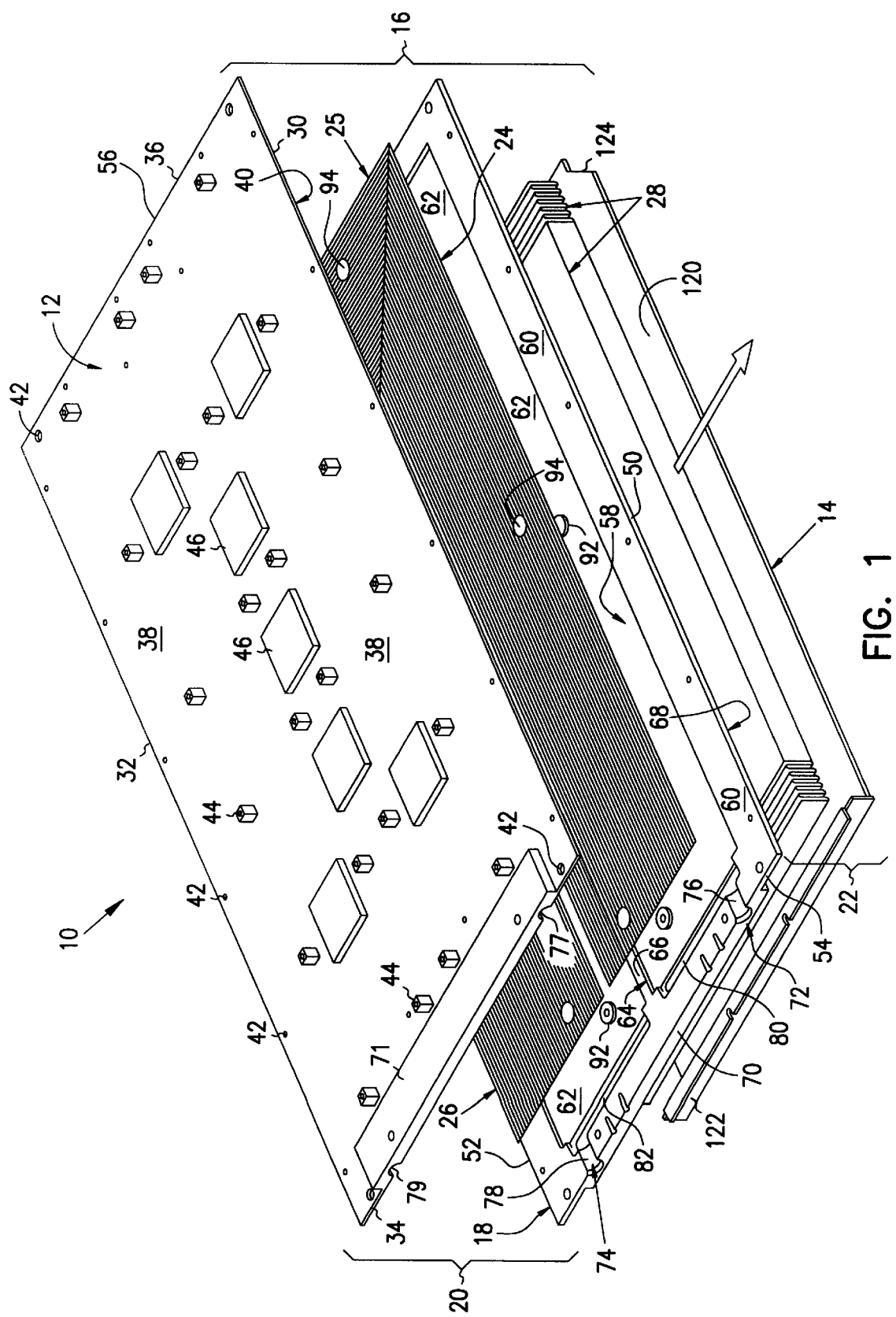
FIG. 1 is an elevational perspective exploded view of a computer circuit module cold plate constructed in accordance with the present invention.
Figure 3:
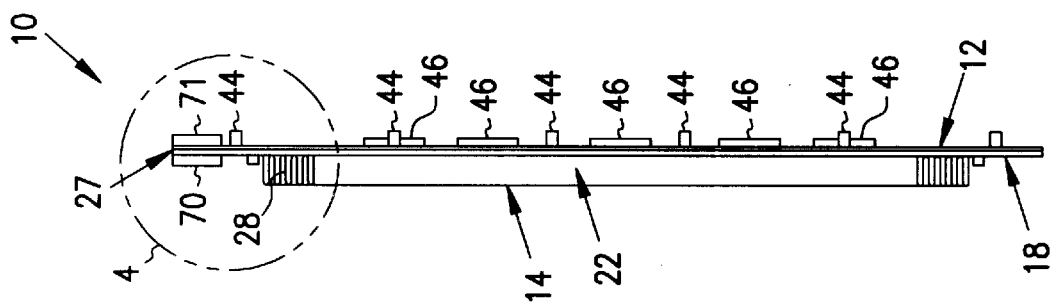
FIG. 3 is a side elevational view of the cold plate shown in FIG. 2.
Figure 2:
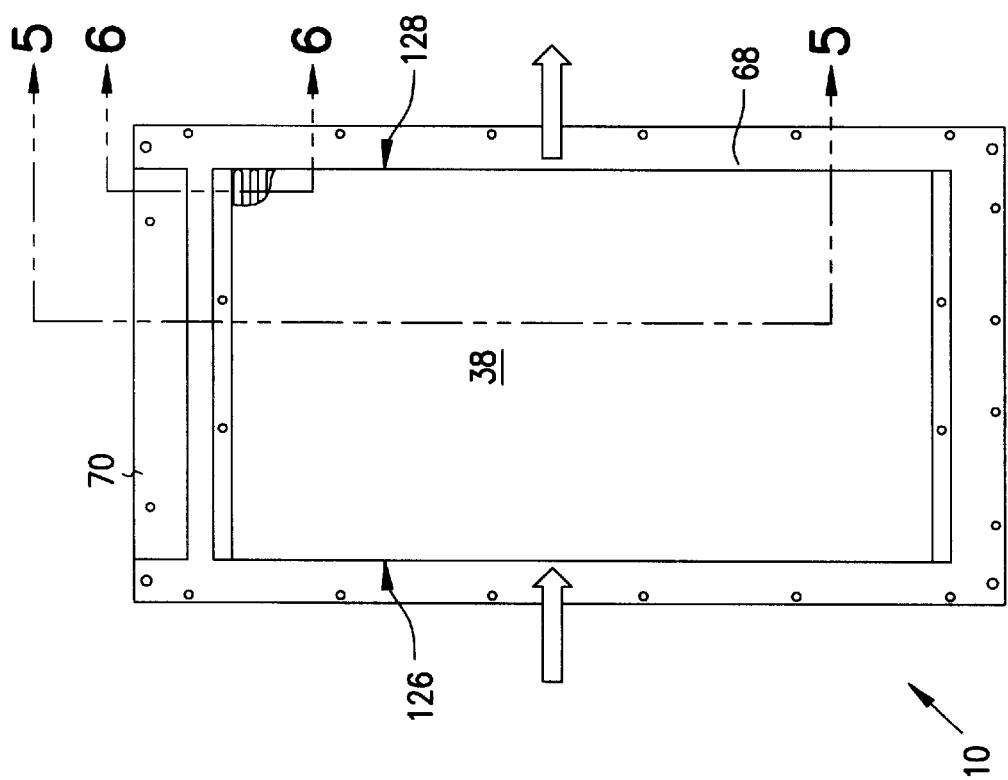
FIG. 2 is a bottom plan view of the cold plate of FIG. 1 as assembled.
Figure 4:
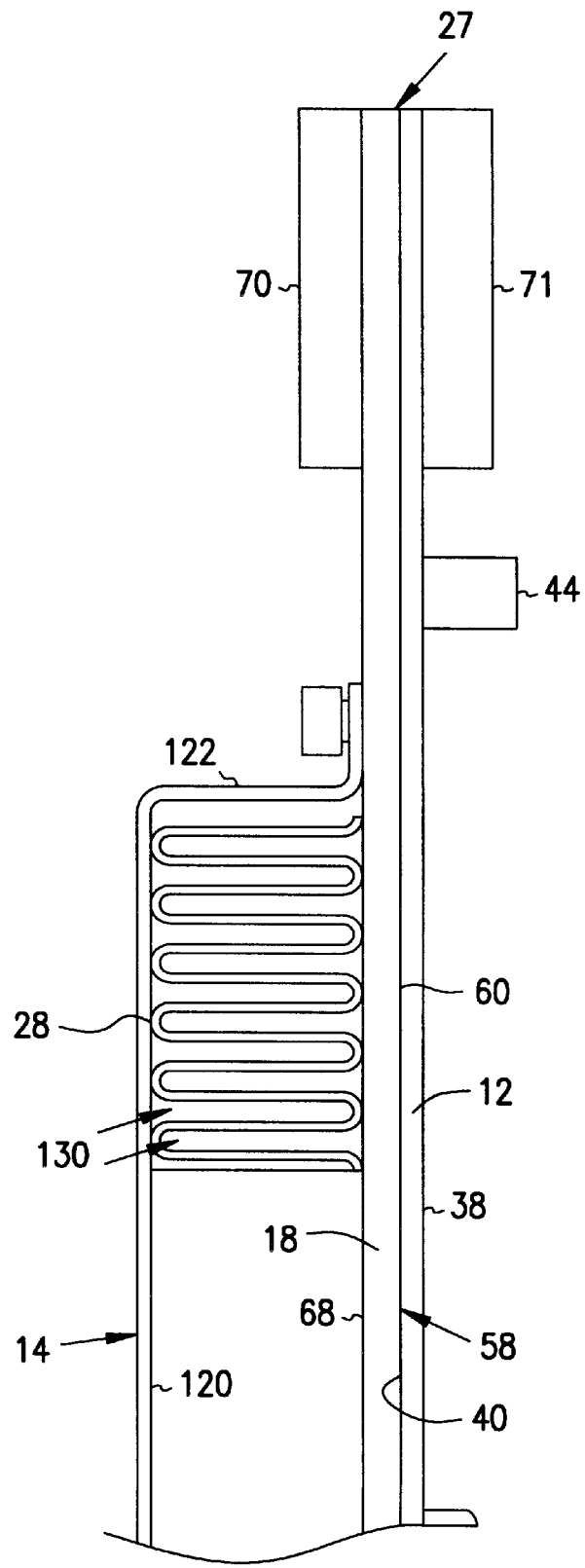
FIG. 4 is a partial side elevational view of the cold plate taken from circle 4 in FIG. 3.

Referring now to the drawings, FIG. 1 illustrates an exploded view of a preferred embodiment of a cold plate 10 constructed in accordance with the present invention. Cold plate 10 has a mounting plate 12 adapted for conducting heat from clock printed circuit board assembly (not shown) thereon. A cover 14 is disposed generally parallel to and spaced from mounting plate 12 defining a cooling chamber 16 therebetween. A divider plate 18 is positioned generally parallel to and sandwiched between mounting plate 12 and cover 14 for dividing cooling chamber 16 into a liquid cooled section 20 and an air cooled section 22. In the presently preferred embodiment, three internal cooling fin assemblies 24, 25, and 26 are positioned in liquid cooled section 20 between mounting plate 12 and divider plate 18 for providing the heat exchanger characteristics of the liquid cooled section. A manifold 27 (best shown in FIGS. 3 and 4) is disposed at one end of cold plate 10 for connecting to a liquid coolant source and directing the coolant into and out of liquid cooled section 20. An external fin assembly 28 is disposed in air cooled section 22 between divider plate 18 and cover 14 for providing the heat exchanger characteristics of the air cooled section.

Figure 5:
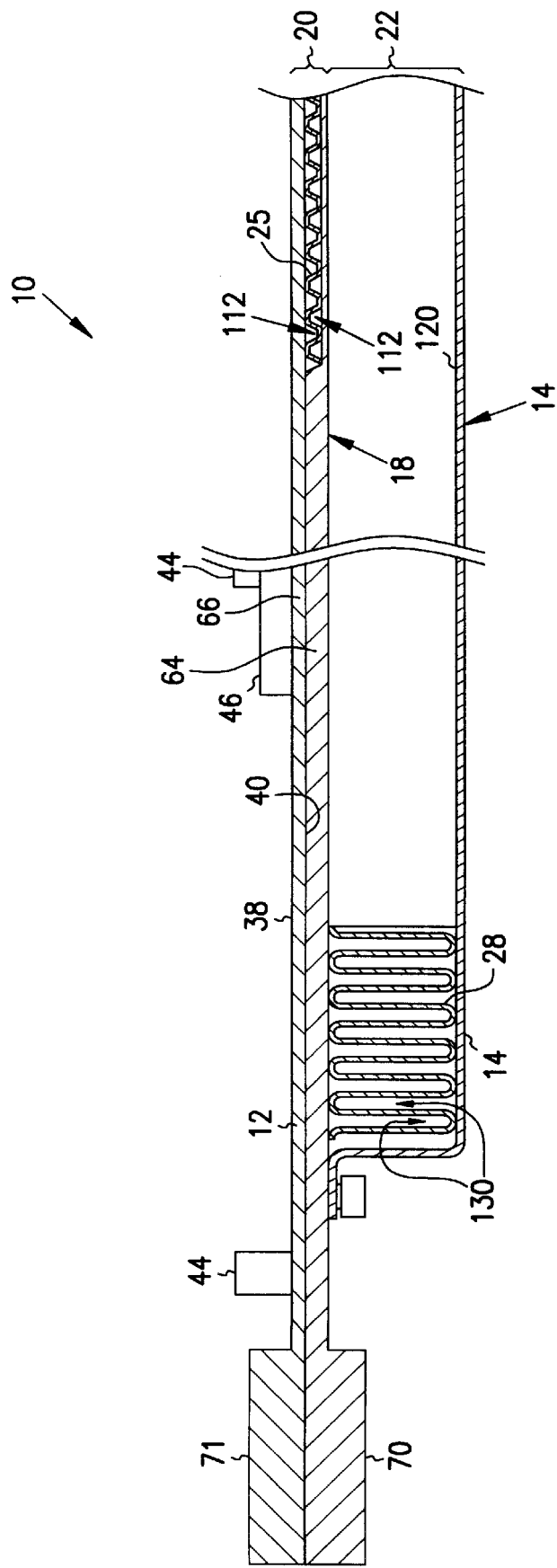
FIG. 5 is a partial sectional view of the cold plate taken along line 5—5 of FIG. 2 illustrating part of the air and liquid cooled sections.
Figure 6:
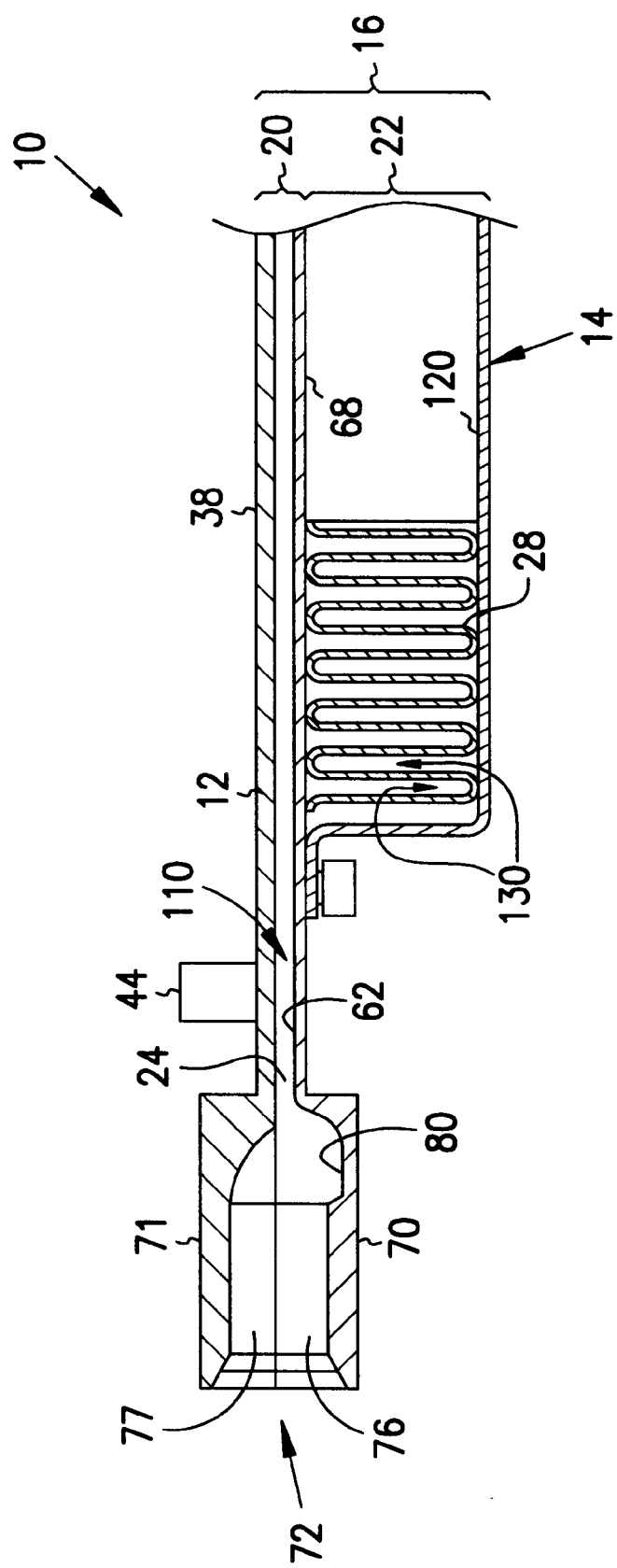
FIG. 6 is a partial sectional view of the cold plate taken along line 6—6 of FIG. 2 illustrating the inlet portion of the manifold.

Mounting plate 12 of the preferred embodiment has a generally rectangular shape including a pair of elongate parallel sides 30, 32 and parallel ends 34, 36 which are essentially perpendicular to the sides. Mounting plate 12 has a board mounting surface 38 which faces outwardly from cold plate 10 and is adapted to carry the clock printed circuit board assembly thereon (not shown). FIGS. 5 and 6 best illustrate a cooling surface 40 disposed opposite board mounting surface 38 on mounting plate 12 adjacent liquid cooled section 20 of cooling chamber 16.

As will be described in more detail herein, cooling surface 40 may be formed in such a manner as to define a portion of liquid cooled section 20 or may merely be a planar surface abutting adjacent divider plate 18 wherein the important characteristics of liquid cooled section 20 are formed in the divider plate. Mounting plate 12 is preferably constructed from a material having high thermal conductivity so that heat generated by the printed circuit board assembly components is easily transferred through the mounting plate to cooling chamber 16. One of many suitable materials is aluminum 6061 which is relatively common, light-weight and inexpensive and has sufficiently high thermal conductivity. Other materials may be suitable as well such as copper or copper and aluminum alloys. Mounting plate 12 may be formed by a machined aluminum or cast aluminum process to include, as shown in FIG. 1, any necessary mounting holes 42, spacers 44, and circuit pedestals or bumps 46 as formations integral with the mounting plate.

The electronic components including the integrated circuits are mounted to the clock board assembly sandwiched between mounting plate 12 and the board. Spacers 44 project from board mounting surface 38 to provide sufficient separation between mounting plate 12 and the board assembly to provide clearance for the components. The components have varying heights so spacers 44 must project enough to provide clearance for the tallest component. Bumps 46 are positioned on mounting surface 38 such that they confront the shorter components upon assembly of the module to take up the excess space or gap between the component and mounting surface 38. Intimate contact between the components and mounting surface 38 is highly desirable to achieve adequate heat dissipation.

Cover 14 of the preferred embodiment may be constructed from any number of materials such as plastic or metal since it essentially acts as a duct for defining air cooled section 22 and an air inlet and outlet to be described below. It is preferred that cover 14 be relatively light weight, strong and durable so that it does not add significantly to the size or weight of the clock module assembly and yet performs its function without need for repair or replacement.

Divider plate 18 is also preferably constructed from a relatively light weight, common and inexpensive material such as aluminum 6061 having significant heat transfer characteristics. Divider plate 18 of the preferred embodiment is of a generally rectangular configuration and about the same size as mounting plate 12 and has a pair of elongate parallel sides 50, 52 and parallel ends 54, 56 which are essentially perpendicular to the sides. Divider plate 18 is sandwiched between mounting plate 12 and cover 14 and has a liquid cooling side 58 disposed facing cooling surface 40 of mounting plate 12 for defining liquid cooled section 20 of cooling chamber 16 therebetween. Liquid cooling side 58 includes an outer mating surface 60 adjacent sides 50, 52 and ends 54, 56 for sealingly mating against cooling surface 40 of mounting plate 12 when cold plate 10 is assembled. Liquid cooling side 58 has an inner recessed surface 62 surrounded by and recessed below mating surface 60. A partially bisecting vertical wall 64 extends from mating surface 60 at end 54 along a portion of recessed surface 62 but does not extend to mating surface 60 at end 56. The top 66 of wall 64 is essentially flush with mating surface 60 and abuts cooling surface 40 of mounting plate 12 upon assembly. An air cooling surface 68 which is essentially planar in the preferred embodiment is disposed on the opposite side of divider plate 18 and faces cover 14 for defining air cooled section 22 therebetween.

To form manifold 27 a block 70 is formed on end 54 integral with divider plate 18. Block 70 is essentially flush with mating surface 60 on one side and protrudes outward from air cooling surface 60 on the other. A corresponding second block 71 is formed at the one end 34 integral with mounting plate 12 and is essentially flush with cooling surface 40 on one side and protrudes outward from board mounting surface 38 on the other. Blocks 70 and 71 are constructed and arranged such that they abut adjacent one another and form manifold 27 when mounting plate 12 and divider plate 18 are assembled together in cold plate 10.

A coolant fluid inlet 72 and outlet 74 communicate with liquid cooled section 20 and are disposed in manifold 27 and defined by abutting blocks 70 and 71. As best illustrated in FIGS. 1 and 6, a pair of semi-cylindrical corresponding inlet grooves 76 and 77 are formed in blocks 70 and 71, respectively, such that when divider plate 18 and mounting plate 12 are assembled, the inlet grooves form cylindrical inlet 72. Similarly, a pair of semi-cylindrical corresponding outlet grooves 78 and 79 are formed in blocks 70 and 71, respectively, which form cylindrical outlet 74. In the preferred embodiment, an elongate inlet trough 80 is formed within block 70 perpendicular to and communicating with inlet 72 and generally parallel to end 54 of divider plate 18. An elongate outlet trough 82 is similarly formed in thickened block 70 perpendicular to and communicating with outlet 74 and generally parallel to end 54. Inlet trough 80 communicates with recessed surface 62 on the side of wall 66 nearer side 50 of divider plate 18. Outlet trough 82 communicates with recessed surface 62 nearer side 52 of plate 18. As will be evident to those skilled in the art, the manifold construction may take on any number of configurations without departing from the scope of the present invention.

Figure 7:
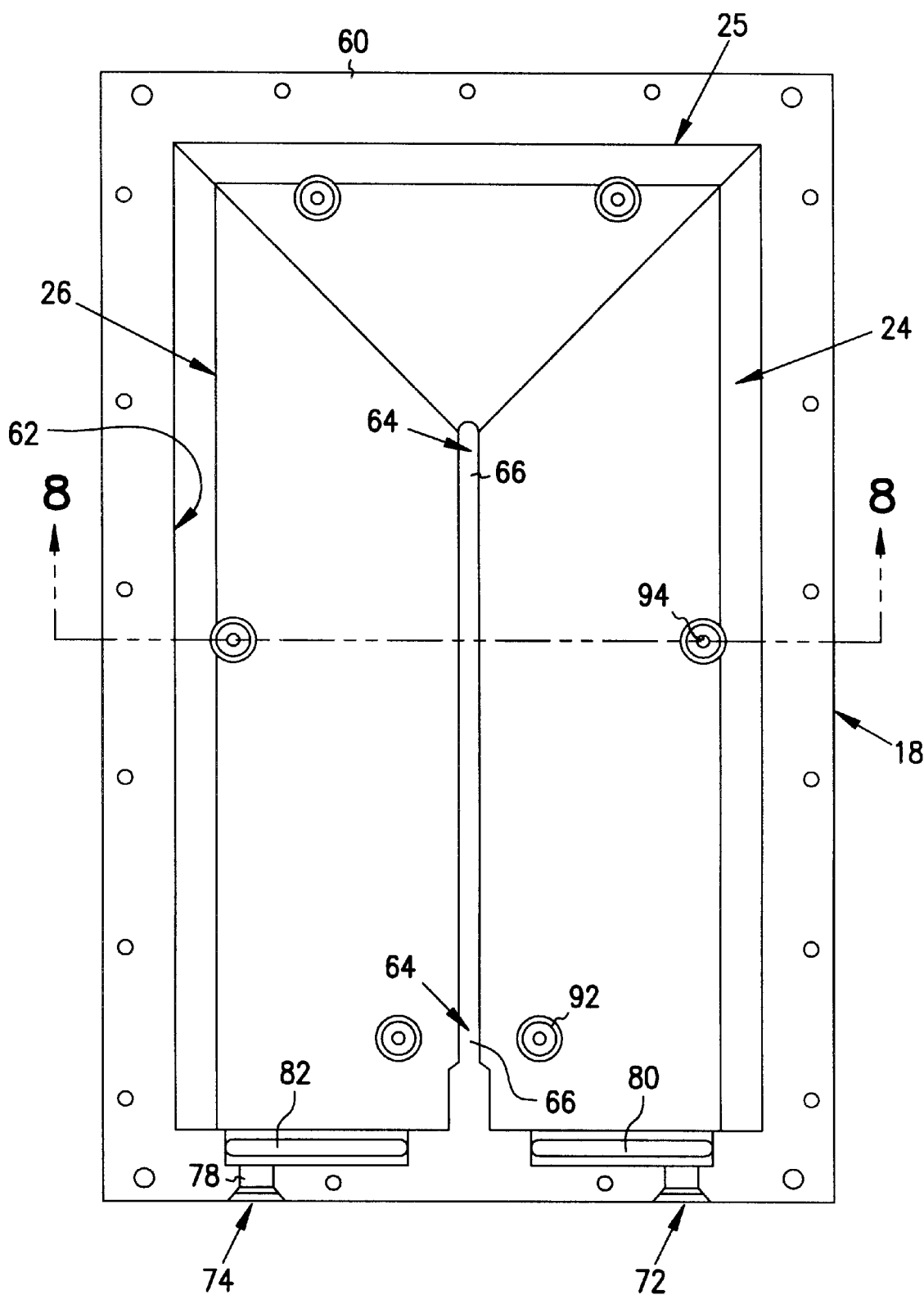
FIG. 7 is a plan view of the divider plate of the cold plate of FIG. 1 illustrating the internal fin and recessed surface configuration.

Inner recessed surface 62 is formed in liquid cooling side 58 of divider plate 18 for receiving therein internal fin assemblies 24, 25, and 26. The depth of recess 62 is preferably such that when internal fins 24, 25, and 26 are placed therein the exposed surface is essentially flush with the height of outer mating surface 60. The general size and contour of recessed surface 62 illustrated in FIG. 7 is preferably large enough to cover a significantly large portion of the surface area of liquid cooling side 58 to provide adequate cooling of the clock circuit board assembly. Internal fin assemblies 24, 25 and 26 preferably and in combination cover the entire recessed surface 62 when placed therein.

A plurality of cylindrical slugs or spacers 92 are preferably formed integral with divider plate 18 projecting upward from recessed surface 62 to a height essentially flush with mating surface 60 and equivalent to the height of internal fin assemblies 24, 25, and 26. Spacers 92 positively locate and position internal fins 24, 25, and 26 and prevent mounting plate 12 from crushing the internal fins which would otherwise deter free flow of coolant through the fins. To properly locate internal fin assemblies 24, 25 and 26 within recessed surface 62, a plurality of spacer openings 94 are formed through internal fin assemblies 24, 25 and 26. Openings 94 are precisely positioned for receiving slugs 92 therethrough when the internal fins are placed in the recessed surface.

Inlet trough 80 and outlet trough 82 must communicate with recessed surface 62, as shown in FIG. 1, to permit coolant to flow from inlet 72 into inlet trough 80 and over the internal fins 24, 25, and 26. Coolant must flow freely into outlet trough 82 from recessed surface 62 into outlet 74 for cold plate 10 to provide proper cooling of the clock printed circuit board assembly. In an alternative embodiment, a corresponding second inlet trough and outlet trough may be formed in corresponding second block 71 to confront inlet trough 80 and outlet trough 82, respectively when cold plate 10 is assembled. This alternative construction of the troughs would be similar to the construction of the inlet 72 and outlet 74 of the preferred embodiment. Additionally, a corresponding recessed surface which confronts recessed surface 62 may be formed in cooling surface 40 of mounting plate 12 to provide a portion of the necessary space between the mounting plate and divider plate 18 for internal fin assemblies 24, 25, and 26. In the preferred embodiment, cooling surface 40 of mounting plate 12 is essentially planer to reduce the cost and simplify the manufacture of tooling necessary for producing the mounting plate. In the preferred embodiment the coolant flow path is defined only by recessed surface 62 and troughs 80 and 82 formed in liquid cooling side 58 of divider plate 18.

Figure 8:
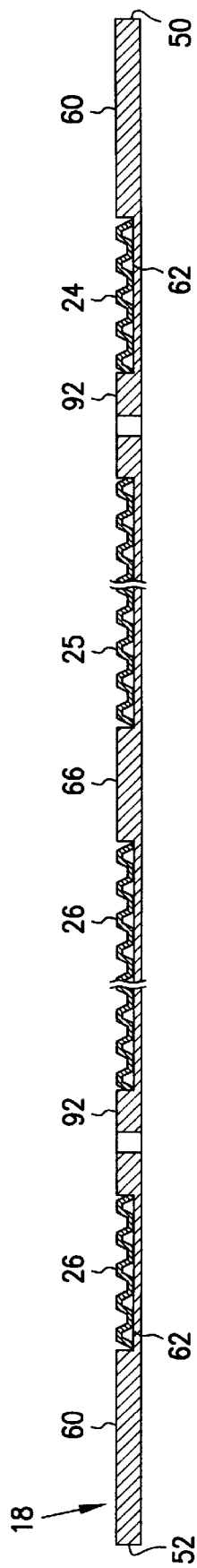
FIG. 8 is a sectional view of the cold plate taken along line 8—8 of FIG. 7.

Internal fin assemblies 24, 25, and 26 of the present embodiment are preferably formed from a thin metallic material such as aluminum, having excellent heat transfer characteristics. Fins 24, 25, and 26 preferably have a corrugated construction viewed in the cross section as best illustrated in FIG. 5 (showing fin 25) and FIG. 8 (showing fins 24 and 26) which define longitudinal coolant flow channels 110, 112 and 114, respectively, between the corrugated fins. In the preferred embodiment illustrated in FIG. 7, internal fin 24 is disposed in recessed surface 62 such that flow channels 110 communicate with inlet trough 80 and hence coolant inlet 72 for directing coolant along the flow channels towards fin 25. Flow channels 112 of internal fin 25 are preferably disposed perpendicular to flow channels 110 of internal fin 24 such that coolant fluid will be directed from internal fin 24 into internal fin 25 and further directed towards internal fin 26. Flow channels 114 of fin 26 are preferably disposed perpendicular to channels 112 of internal fin 25 and hence parallel to channels 110 of internal fin 24. Such a construction will direct coolant fluid from internal fin 25 over internal fin 26 to outlet trough 82 and hence through coolant outlet 74.

The internal fins 24, 25, and 26 preferably contact cooling surface 40 of mounting plate 18 and recessed surface 62 of divider plate 18 for providing optimal heat transfer to the coolant flowing therethrough. To provide coolant flow channels 110, 112 and 114 having no obstructions therethrough over the combination of internal fins 24, 25, and 26, it is preferred that flow channels 110 and 112 of adjacent internal fin assemblies 24 and substantially align with one another forming a continuous flow channel therethrough. Similarly, it is preferred that coolant flow channels 112 and 114 of adjacent internal fins 25 and 26 also form such a continuous channel.

On the opposite side of divider plate 18, air cooling surface 68 is essentially planar except for block 70 of manifold 27 which protrudes therefrom nearest one end 54. Cover 14 includes a large rectangular inner surface 120 spaced from air cooling surface 68 by a pair of legs 122 and 124 disposed at opposite ends of inner surface 120. Air cooled section 22 of cooling chamber 16 is defined by inner surface 120 of cover 14, legs 122 and 124, and air cooling surface 68 of divider plate 18. Legs 122 and 124 effectively close off the ends of air cooled section 22. The sides of air cooled section 22 remain open and define an air inlet 126 and an air outlet 128 which open into the air cooled section. External fin assembly 28 is preferably captured within air cooled section 22 and fills essentially the entire space therein. Legs 122 and 124 preferably space apart inner surface 120 of cover 14 from air cooling surface 68 of divider plate 18 such that external fin assembly 28 contacts both the air cooling surface and cover inner surface without being crushed or deformed thereby.

External fin assembly 28 is also preferably constructed from aluminum and has a corrugated construction viewed in cross section and defines a plurality of longitudinal air flow channels 130, as best illustrated in FIGS. 5 and 6. It is preferred that external fin assembly 28 however has a larger or higher amplitude corrugation than internal fin assemblies 24, 25 and 26 for providing a larger heat transfer surface area over which air can flow and for providing a larger volume space for air to flow through in air cooled section 22. This is because a liquid coolant apparatus typically provides more efficient cooling per unit surface area than an air cooling apparatus. Again it is also preferred that external fin assembly 28 is in contact with inner surface 120 of cover 14 and air cooling surface 68 of divider plate 18 for providing optimal heat transfer characteristics.

The cold plate 10 of the present invention may be constructed having air cooled section 22 disposed between mounting plate 12 and liquid cooled section 20 as will be evident to one of ordinary skill in the art. With the construction of the preferred embodiment, however, both sections provide adequate cooling. The liquid cooled section is relatively thin because this type of cooling provides very efficient cooling and it is adjacent the heat source. The air cooled section is therefore spaced near the heat source as well. To use the liquid cooled section of the construction of the alternative embodiment, heat would transfer less efficiently by conduction through fin assembly 28 and by convection and radiation through dead air in air cooled section 22 before reaching liquid cooled section 20. To use the air cooled section in the preferred embodiment, heat is transferred by conduction through mounting plate 12 to divider plate 18 through mating surface 60 and fin assemblies 24, 25 and 26. Heat is also transferred by convection and radiation through the thin or short space between recessed surface 62 and board mounting surface 38 of mounting plate 12.

In using cold plate 10 of the present invention, a clock printed circuit board assembly (not shown) is mounted to board mounting surface 38 of mounting plate 12 forming a computer clock module. The module is then installed into a computer and operably interconnected with other circuit and clock modules of the computer. Depending upon the application, the type of computer, and/or the necessary cooling requirements for dissipating waste heat generated by the densely packed high-speed computer components, either liquid cooled section 20 or air cooled section 22 will be connected to the appropriate coolant source.

In a liquid cooled approach, a liquid coolant source line is attached to coolant inlet 72 and a return line attached to outlet 74 if the type of cooling required for the particular application is liquid cooling. An appropriate coolant such as deionized water or fluorinert is circulated at a relatively cool temperature through liquid cooled section 20 over internal fin assemblies 24, 25, and 26 through flow channels 110, 112 and 114 as described above while the computer is operating. Heat generated by the electronic components of the computer will pass into mounting plate 12 through board mounting surface 38 to cooling surface 40 where it will be transferred by the internal fin assemblies to the coolant and carried away through fluid outlet 74. Coolant exiting from outlet 74 will be at a higher temperature than that entering inlet 72 and will thus need to be run through a heat exchanger to reduce the coolant temperature before it is recirculated back into fluid inlet 72. Cooling characteristics of liquid cooled section 20 depend on the type and temperature of coolant, the volume and velocity at which the coolant flows through the liquid cooled section, and the material and surface area of the fins 24, 25 and 26, the mounting plate 12, and the divider plate 18.

If the particular application in which cold plate 10 is installed requires air cooling, a source of relatively cool forced air is attached to air inlet 126 of air cooled section 22 between cover 14 and divider plate 18. Heat generated by the printed circuit board components will pass into mounting plate 12 through board mounting surface 38 to cooling surface 40. The heat will then pass through the unused liquid cooled section 20 into divider plate 18 to air cooling surface 68 and to external fin assembly 28. The forced air flows through air flow channels 130 in external fin assembly 28 transferring heat thereto and exits from air outlet 128 of air cooled section 22. The exit air temperature is higher than the entering air temperature. The exit air may either be run through a heat exchanger to reduce the air temperature and then recirculated through the air cooled section or may be transferred to atmosphere, in which case the entering forced air will be supplied from atmosphere as well. Cooling characteristics of air cooled section 22 depend on the temperature of the source air, the volume and velocity of air which passes through the air cooled section and the material and surface area of external fin assembly 28, divider plate 18 and cover 14.

The cold plate of the present invention is adaptable for use in circuit modules requiring either air or liquid cooling providing adequate and efficient air or liquid cooling for computer circuit modules. The cold plate replaces two separate liquid cooled and air cooled cold plates thereby reducing the number of parts required to build circuit modules for different applications. The cold plate of the invention simplifies the module manufacturing process by reducing the variety of parts to track and stock.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A cold plate, comprising,
   a mounting plate for carrying thereon a printed circuit board assembly,
   a cover generally parallel to and spaced from said mounting plate, and
   a cooling chamber defined by the space between said cover and said mounting plate, said cooling chamber comprising:
      a liquid cooled section disposed within said cooling chamber and including a coolant inlet, a coolant outlet, and at least one coolant flow channel for directing a liquid coolant from said coolant inlet through said liquid cooled section to said coolant outlet for carrying away heat generated by said printed circuit board assembly, and
      an air cooled section disposed within said cooling chamber and positioned between said cover and said liquid cooled section and including an air inlet, an air outlet, and at least one air flow channel for directing air from said air inlet through said air cooled section to said air outlet for carrying away heat generated by said printed circuit board assembly,
   wherein the mounting plate includes a cooling surface and a board mounting surface, wherein the board mounting surface is adapted to receive the printed circuit board assembly thereon and wherein the cooling surface faces into said cooling chamber.

2. The cold plate of claim 1 wherein said liquid cooled section and said air cooled section of said cooling chamber are separated by a divider plate disposed generally parallel to and between said mounting plate and said cover.

3. The cold plate of claim 2 wherein said divider plate has an air cooling surface on one side disposed adjacent said air cooled section and a liquid cooling side on the other side of said divider plate disposed adjacent said liquid cooled section.

4. The cold plate of claim 3 wherein said liquid cooled section of said cooling chamber further comprises at least one internal fin assembly retained therein.

5. The cold plate of claim 3 wherein said air cooled section is disposed within said cooling chamber between said cover and said air cooling surface of said divider plate, and said liquid cooled section is disposed within said cooling chamber between said mounting plate and said liquid cooling side of said divider plate.

6. The cold plate of claim 4 wherein said at least one internal fin assembly is of a corrugated construction having a plurality of longitudinal and essentially parallel corrugations defining a plurality of said coolant flow channels therebetween.

7. The cold plate of claim 6 wherein said liquid cooled section further includes three of said internal fin assemblies each defining a plurality of said coolant flow channels.

8. The cold plate of claim 7 wherein said three internal fin assemblies are constructed and arranged such that coolant will flow from said coolant inlet to said coolant outlet through a plurality of continuous flow channels defined by said flow channels of said three internal fin assemblies.

9. The cold plate of claim 1 wherein said air cooled section of said cooling chamber further includes at least one external fin assembly retained therein.

10. The cold plate of claim 9 wherein said at least one external fin assembly is of a corrugated construction having a plurality of longitudinal and essentially parallel corrugations defining a plurality of said air flow channels therebetween.

11. A cold plate, comprising,
a mounting plate for carrying thereon a printed circuit board assembly,
a cover generally parallel to and spaced from said mounting plate, and
a cooling chamber defined by the space between said cover and said mounting plate, said cooling chamber comprising:
   a liquid cooled section disposed within said cooling chamber and including a coolant inlet, a coolant outlet, at least one internal fin assembly and at least one coolant flow channel for directing a liquid coolant from said coolant inlet through said liquid cooled section to said coolant outlet in order to carry away heat generated by said printed circuit board assembly, and
   an air cooled section disposed within said cooling chamber separate from said liquid cooled section and including an air inlet, an air outlet, and at least one air flow channel for directing air from said air inlet through said air cooled section to said air outlet for carrying away heat generated by said printed circuit board assembly,
wherein said liquid cooled section and said air cooled section of said cooling chamber are separated by a divider plate disposed generally parallel to and between said mounting plate and said cover, wherein said divider plate has an air cooling surface on one side disposed adjacent said air cooled section and a liquid cooling side on the other side of said divider plate disposed adjacent said liquid cooled section, wherein a portion of said liquid cooling side of said divider plate comprises a recessed surface for receiving therein said at least one internal fin assembly.

12. A cold plate for a computer clock module comprising,
a mounting plate for carrying thereon a clock printed circuit board assembly,
a cover generally parallel to and spaced from said mounting plate,
a cooling chamber defined by the space between said cover and said mounting plate, said cooling chamber comprising:
   a divider plate having an air cooling surface on one side and a liquid cooling side on the other side, said divider plate being disposed generally parallel to and between said mounting plate and said cover,
   a liquid cooled section within said cooling chamber between said liquid cooling side of said divider plate and said mounting plate, and including a coolant inlet, a coolant outlet, and a plurality of coolant flow channels for directing a liquid coolant from said coolant inlet through said liquid cooled section to said coolant outlet for carrying away heat generated by said clock printed circuit board assembly, and
   an air cooled section within said cooling chamber separate from said liquid cooled section between said air cooling side of said divider plate and said cover, and including an air inlet, an air outlet, and a plurality of air flow channels for directing air from said air inlet through said air cooled section to said air outlet for carrying away heat generated by said clock printed circuit board assembly.

13. The cold plate of claim 12 wherein said plurality of coolant flow channels are formed by inserting into said liquid cooled section a corrugated construction having a plurality of longitudinal and essentially parallel corrugations defining said plurality of coolant flow channels therebetween.

14. The cold plate of claim 13 wherein said corrugated construction includes three internal fin assemblies constructed and arranged such that coolant will flow from said coolant inlet to said coolant outlet through a plurality of continuous flow channels defined by said flow channels of said three internal fin assemblies.

15. The cold plate of claim 12 wherein said plurality of air flow channels are formed by inserting into said air cooled section a corrugated construction having a plurality of longitudinal and essentially parallel corrugations defining said air flow channels therebetween.

* * * * *

UNITED STATES PATENT AND TRADEMARK OFFICE
CERTIFICATE OF CORRECTION

PATENT NO. : 6,305,463 B1
DATED : October 23, 2001
INVENTOR(S) : Richard B. Salmonson It is certified that error appears in the above-identified patent and that said Letters Patent is hereby corrected as shown below:

Column 4,
Line 43, insert -- , -- after "27".

Column 5,
Line 57, insert -- , -- after "embodiment".

Column 7,
Line 62, insert -- the -- between "from" and "atmosphere".

Column 10,
Line 12, delete "side" after "cooling" and insert -- surface --, therefor.
Line 30, delete "." after "assembly" and insert -- , wherein the mounting plate includes a cooling surface and a board mounting surface, wherein the board mounting surface is adapted to receive the printed circuit board assembly thereon and wherein the cooling surface faces into said cooling chamber. --, therefor.

Signed and Sealed this

Fourth Day of June, 2002

*Attest:*

*Attesting Officer*

JAMES E. ROGAN
*Director of the United States Patent and Trademark Office*